United States Patent [19]

Shindo et al.

[11] Patent Number: 5,048,179
[45] Date of Patent: Sep. 17, 1991

[54] IC CHIP MOUNTING METHOD

[75] Inventors: Masahiro Shindo; Toshikazu Yoshimizu, both of Toyonaka; Kenichi Kurihara, Yohohama; Shunpei Tamaki, Takarazuka; Toshio Kawakami, Suita; Yukio Kadowaki; Shoji Matsumoto, both of Minoo, all of Japan

[73] Assignee: Ricoh Company, Ltd., Tokyo, Japan

[21] Appl. No.: 480,013

[22] Filed: Feb. 14, 1990

Related U.S. Application Data

[62] Division of Ser. No. 53,264, May 22, 1987, abandoned.

[30] Foreign Application Priority Data

May 23, 1986 [JP] Japan .................. 61-119944
May 23, 1986 [JP] Japan .................. 61-119942
Sep. 25, 1986 [JP] Japan .................. 61-227395

[51] Int. Cl.$^5$ .................................. H05K 3/34
[52] U.S. Cl. .................................. 29/840; 29/832; 174/52.4; 357/74; 357/80; 437/209
[58] Field of Search .................. 29/827, 832, 840; 357/74, 80; 174/52.4; 437/207, 209

[56] References Cited

U.S. PATENT DOCUMENTS

| | | | |
|---|---|---|---|
| 3,691,628 | 9/1972 | Kim et al. | 437/209 |
| 3,786,375 | 1/1974 | Sato et al. | 174/52.4 X |
| 3,903,590 | 9/1975 | Yokogawa | 437/209 |
| 4,466,181 | 8/1984 | Takishima | 437/209 |
| 4,829,666 | 5/1989 | Haghiri-Tehrani et al. | 29/827 X |

FOREIGN PATENT DOCUMENTS

58-138057 8/1983 Japan .
59-22353 2/1984 Japan .

Primary Examiner—Carl J. Arbes
Attorney, Agent, or Firm—Cooper & Dunham

[57] ABSTRACT

An IC mounting method and its resulting structure, such as an IC card is provided. An IC card includes a metal plate formed with at least one hole, and an IC chip is located fixed in position in the hole with a filler material filling the gap between the hole and the IC chip. An interconnect pattern is provided on the plate with an electrically insulating film sandwiched therebetween, and the interconnect pattern is in electrical contact with a contact pad of the IC chip. Preferably, the surface of the IC chip on which the contact pad is provided is substantially flush with one surface of the plate. When an electrically insulating film is fixedly attached to a substrate having a hole, in which an IC chip is fixedly provided, by an adhesive agent, the material of the film is selected to be similar to the material of the adhesive agent. In this manner, a contact hole may be formed in registry with a contact pad of the IC chip in the insulating film by one etching step without formation of a stepped portion in the resulting contact hole. Moreover, a film to be later removed is first formed on a substrate, and after providing elements on the film and its supporting structure, a predetermined processing, such as exposure to light, is applied to the film to change its property, thereby causing the elements to be separated away from the film.

17 Claims, 9 Drawing Sheets

IC CHIP MOUNTING METHOD

This is a division of application Ser. No. 07/053,264, filed 05-22-87, now abandoned.

BACKGROUND OF THE INVENTION

1. Field of the Invention

This invention generally relates to a method for mounting an electronics module device on a substrate and a product resulting therefrom. More particularly, the present invention relates to an IC chip mounting method and a product resulting therefrom, such as an IC card, or thermal print head.

2. Description of the Prior Art

An IC card is increasingly drawing an attention. Typically, a prior art IC card includes substrate which is prepared by providing a plastic plate. A recess is formed at a surface of the substrate and an IC chip is received and fixedly attached in the recess, as disclosed in Japanese Patent Laid-Open Pubs. Nos. 58-138057 and 59-22353. However, the prior art uses a plastic material for its substrate, so that there is a disadvantage of low resistance against bending. This imposes limitations in determining the location in providing an IC chip on the plastic substrate. For example, an IC chip has to be located at or near the corner of a plastic substrate rectangle in shape. In addition, use is often made of wire bonding, tape carrier bonding and flip-chip bonding in mounting an IC chip on a substrate; however, these bonding methods necessarily make the overall thickness of a resulting IC card larger, so that it hinders to make an IC chip thinner, which is normally desired.

SUMMARY OF THE INVENTION

In accordance with one aspect of the present invention, there is provided an improved method for mounting an IC chip on a substrate, wherein the substrate includes a metal plate which is provided with at least one hole and an IC chip is fixedly held in position inside of the hole by filling a resin material in the gap between the IC chip and the hole. The IC chip has a main surface on which at least one bump is provided and the metal substrate also has a main surface which is substantially flush with the main surface of the IC chip when mounted in the substrate. An electrically insulating layer is formed on the main surface of the substrate and an interconnection pattern is formed on the insulating layer. The insulating layer extends not only on the main surface of the substrate but also on the main surface of the IC chip, so that the interconnection pattern formed on the insulating layer is in electrical connection with an internal circuit of the IC chip through the bump of the IC chip.

In accordance with another aspect of the present invention, there is provided an IC chip mounting method which comprises the steps of: providing a metal plate having a main surface; forming a hole in said metal plate; placing an IC chip having an electrode on a main surface thereof in said hole and filling a gap between said hole and said IC chip such that a main surface of said IC chip is substantially flush with the main surface of said metal plate; forming an electrically insulating layer on the main surface of each of said metal plate and said IC chip; forming an opening in said electrically insulating layer in registry with the electrode of said IC chip; forming a metal layer on said electrically insulating layer and also in said hole, that portion of said metal layer formed in said hole being in electrical contact with the electrode of said IC chip; and patterning said metal layer to define a desired interconnection pattern for said IC chip.

It is therefore a primary object of the present invention to obviate the disadvantages of the prior art as described above and to provide an improved IC chip mounting method and its resulting product.

Another object of the present invention is to provide an improved IC chip mounting method for mounting an IC chip in a substrate having an increased mechanical strength, such as a metal plate.

A further object of the present invention is to provide an IC chip mounting method and its resulting product which allows to mount an IC chip in any desired place of a substrate and also to provide an interconnection pattern at high accuracy and with great simplicity.

A still further object of the present invention is to provide an IC chip mounting method and its resulting product which requires only one etching step in forming a contact hole through which the IC chip is to be electrically connected to an interconnection pattern formed on an electrically insulating film formed on the IC chip.

A still further object of the present invention is to provide an IC chip mounting method and its resulting product, which allows to mount a plurality of IC chips of different characteristics on the same substrate.

Other objects, advantages and novel features of the present invention will become apparent from the following detailed description of the invention when considered in conjunction with the accompanying drawings.

DESCRIPTION OF THE PREFERRED EMBODIMENTS

Figure 1A:
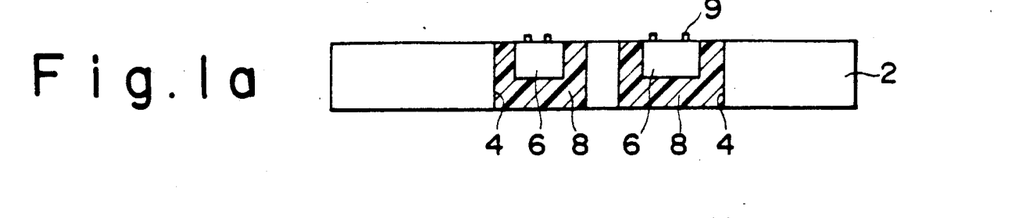
FIGS. 1a through 1f are partly side elevational and partly cross-sectional views showing steps of an IC mounting method in accordance with one embodiment of the present invention.
Figure 1B:
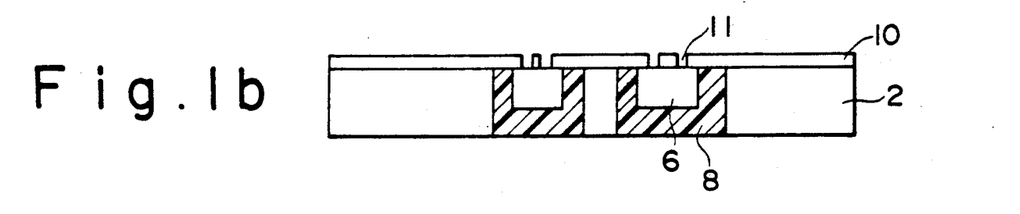
Figures 1C, 1D:
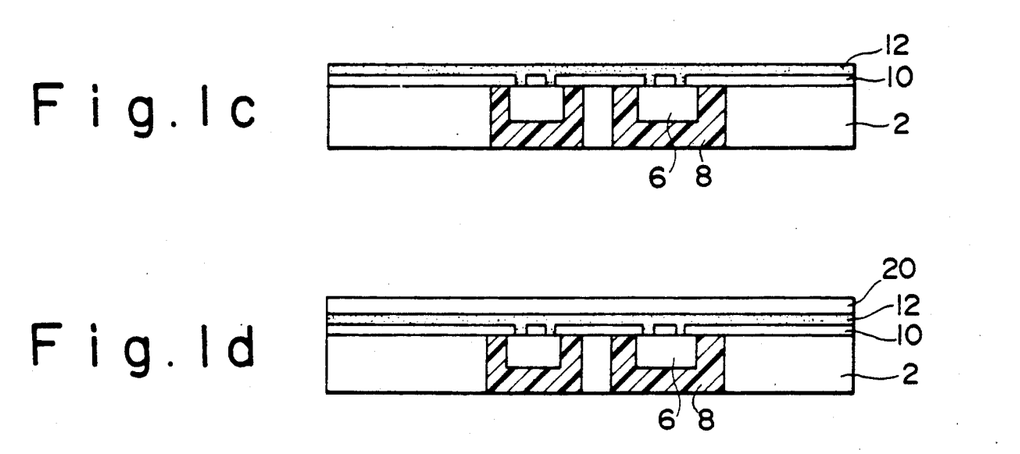
Figure 1E:
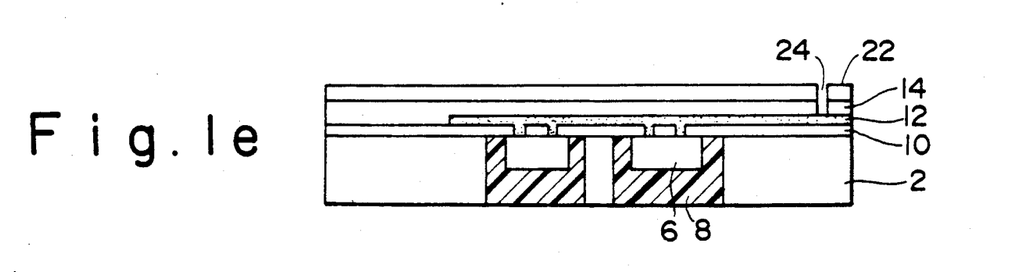
Figure 1F:
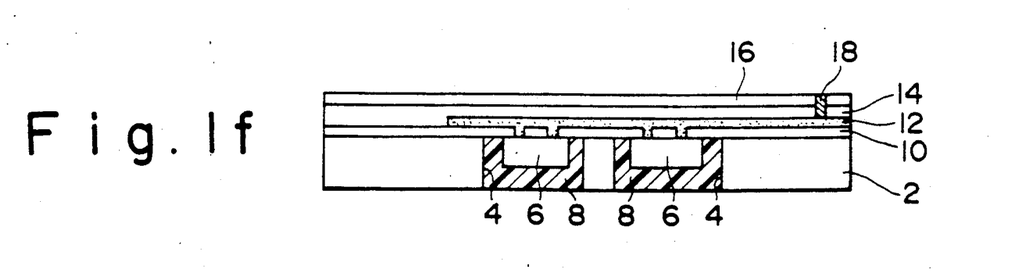

Referring first to FIG. 1f, there is schematically shown an IC chip mounting structure which has been constructed in accordance with one embodiment of the present invention. As shown, the IC chip mounting structure includes a substrate 2 which has an increased mechanical strength, and, thus, the substrate 2 is comprised of a material having an increased mechanical strength, such as a metal, preferably stainless steel. Here, it will be assumed that the substrate 2 is formed by a stainless steel plate of any desired shape. The substrate 2 has a main surface, which corresponds to the top surface in FIG. 1f, and is provided with at least one through hole 4 (two through holes 4 and 4 are shown in FIG. 1f). An IC chip 6, such as a CPU chip or EPROM chip, is located within the hole 6 with its main surface, on which an electrode 9, such as a bump, is provided being positioned substantially in flush with the main surface of the substrate 2. And, a filling resin material 8 is filled in the gap between the hole 4 and the IC chip 6 so as to hold the IC chip 6 fixed in position within the hole 4. The to and bottom surfaces of the filling resin material provided in the gap between the hole 4 and the IC chip 6 are also substantially flush with the main or top and bottom surfaces of the substrate 2, respectively. For example, use may be made of an acrylic resin material as the filling resin material 8.

As also shown in FIG. 1f, an inter-layer insulating film 10 comprised for example of a polyimide resin material is formed on the main surfaces of the IC chip 6 and the substrate 2. And an interconnection pattern 12 of an electrically conductive material, such as aluminum, is formed on this inter-layer insulating film 10. The inter-layer insulating film 10 is provided with a contact hole in registry with a corresponding bump or pad provided in the main surface of the IC chip 6. Thus, the interconnection pattern 12 partly extends into the contact hole formed in the inter-layer insulating film 10 to electrically contact the corresponding pad of the IC chip 6. Covering the interconnection pattern 12 is formed a phosphosilicate glass (PSG) layer 14, on which is formed a passivation layer 16. A via hole is formed as extending through the passivation and PSG layers 16 and 14 and a via 18 is formed in this hole to be in electrical contact with the interconnection pattern 12. If desired, one or more of small holes may be provided in the filler resin material 8 so as to allow heat generated by the IC chip 6 to be dissipated more efficiently. Such small holes may extend from the bottom surface of the filler resin material 8 to the bottom surface of the IC chip 6.

Figure 2:
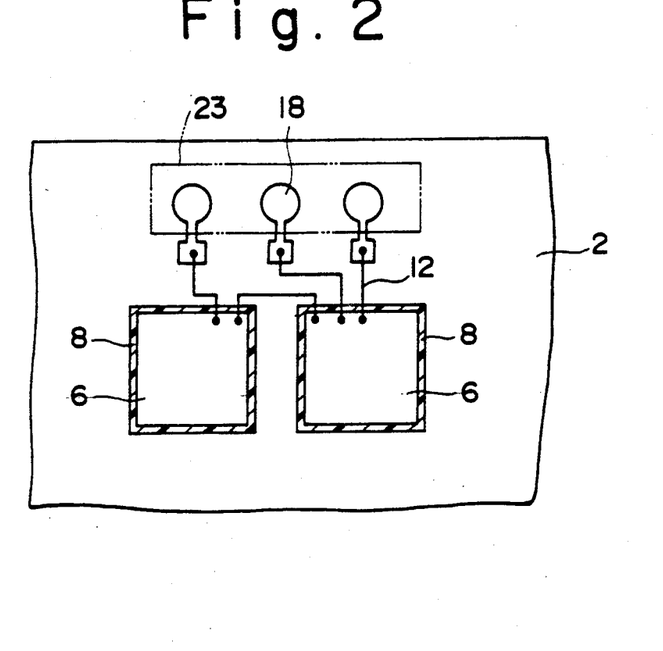
FIG. 2 is a plan view showing the arrangement of various parts in a main portion of an IC card manufactured according to the method shown in FIGS. 1a through 1f.

FIG. 2 schematically shows the arrangement of various elements, including the IC chip 6, via 18 and interconnection pattern of the structure shown in FIG. 1f in plan view. In the present embodiment, the structure shown in FIG. 1f constitutes part of an IC card, and, thus, a region defined by the two-dotted line 23 in FIG. 2 forms an open access section, through which access may be gained to each of the IC chips 6 mounted in the substrate 2.

Referring now to FIGS. 1a through 1f, a sequence of steps of an IC chip mounting method in manufacturing an IC card will be described in detail. As shown in FIG. 1a, there is prepared a substrate 2 comprised of a stainless steel plate generally rectangular in shape. A through hole 4 (two through holes 4 and 4 in the illustrated embodiment) is formed in the substrate 2, for example, by drilling or any other methods. While maintaining an IC chip 6 within the corresponding hole 4, a filler resin material 8, such as an acrylic resin material, is supplied to fill the gap between the hole 4 and the IC chip 6. In this case, the IC chip 6 is so located with its main surface, on which contact pads 9 are formed, substantially in flush with the main surface (top surface in the illustrated example) of the substrate 2.

In accordance with one embodiment, after providing the holes 4 in the substrate, a resin film is adhered to the main (top) surface of the substrate 2 by means of an adhesive agent, and, then, an IC chip 6 is fitted into the corresponding hole 4 with its main surface having thereon the contact pads 9 being brought into contact with the adhesive agent. Then, the acrylic resin material 8 is filled into the gap between the hole 4 and the IC chip 6, thereby causing the IC chip 6 to be fixed in position by hardening the acrylic resin material 8. Thereafter, the resin film and the adhesive agent may be removed or peeled off, for example, by whole surface etching.

Referring now to FIG. 1b, an electrically insulating layer 10 of a polyimide resin material is formed on the main surface of the substrate 2 as well as on the main surface of the IC chip 6 by spinning. A contact hole 11 is formed in the insulating layer 10 in registry with a corresponding pad 9 on the main surface of the IC chip 6 by photolithography. Then, as shown in FIG. 1c, an aluminum layer 12 is formed on the entire surface of the polyimide resin layer 10. Then, as shown in FIG. 1d a photoresist layer 20 is formed on the aluminum layer 12 and the photoresist layer 20 is exposed to a light pattern and developed to form a photoresist pattern. Then, using the photoresist pattern as a mask, the aluminum layer 12 is etched, thereby patterning the aluminum layer 12 to define an interconnection pattern. The resulting aluminum interconnection pattern 12 is in electrical contact with selected ones of the pads 9 on the main surface of the IC chip 6 through the contact hole 11 formed in the polyimide layer 10.

Then, as shown in FIG. 1e, a phosphosilicate glass (PSG) layer 14 is formed on the entire surface of the structure, covering the aluminum interconnection pattern 12, and, then, a photoresist layer 22 is formed on the PSG layer 14. Then, the photoresist layer 22 is exposed to a light pattern and then developed to define a photoresist pattern, which is then used as a mask to form a via hole 24 for an electrode in the PSG layer 14. Then, after forming an electrode including via 18 through the PSG layer 14 from gold, a passivation layer 16 is formed.

If it is desired to make the surface flat, the passivation layer 16 may be ground or polished after formation. Besides, a region in which the aluminum layer 12 is formed may be limited to the interconnection region between the IC chip 6 and the electrode 18. As a material for forming the interconnection pattern, use may be made of any other electrically conductive material, including an alloy of aluminum, copper, chromium and gold, other than aluminum.

Figure 3A:
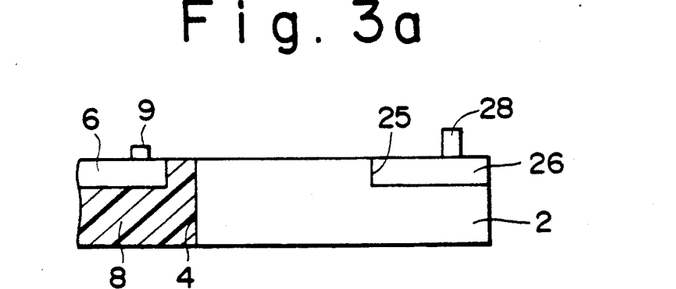
FIGS. 3a and 3b are partly elevational and partly cross-sectional views showing two steps in another IC mounting method in accordance with another embodiment of the present invention.
Figure 3B:
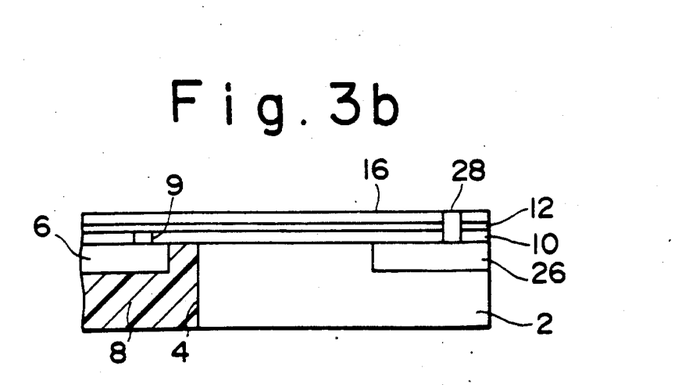

Referring now to FIGS. 3a and 3b, another IC chip mounting method for forming an IC mounting structure in accordance with another embodiment of the present invention will be described. As shown in FIG. 3a, there is provided a stainless steel substrate 2 formed with a hole 4 for placing therein an IC chip 6 and with a recess 25 for receiving therein a printed circuit board 26. The IC chip 6 is fixedly located within the hole 4 by filling a filler resin material 8 in the gap between the hole 4 and the IC chip 6 in a manner similar to that of the previous embodiment described with respect to FIGS. 1a through 1f. Thus, with the IC chip 6 located within the hole 4 fixed in position by means of the filler resin material 8, the main surface of the IC chip 6, where a contact pad 9 is provided, is substantially flush with the main surface (top surface) of the substrate 2. On the other hand, the printed circuit board 26 having a bump 28 formed on its main surface is fixedly fitted into the recess 25 using a filler resin material to fill any gap between the recess 25 and the printed circuit board 26. The main surface of the printed circuit board 26 is also substantially flush with the main surface of the substrate 2.

Figure 4:
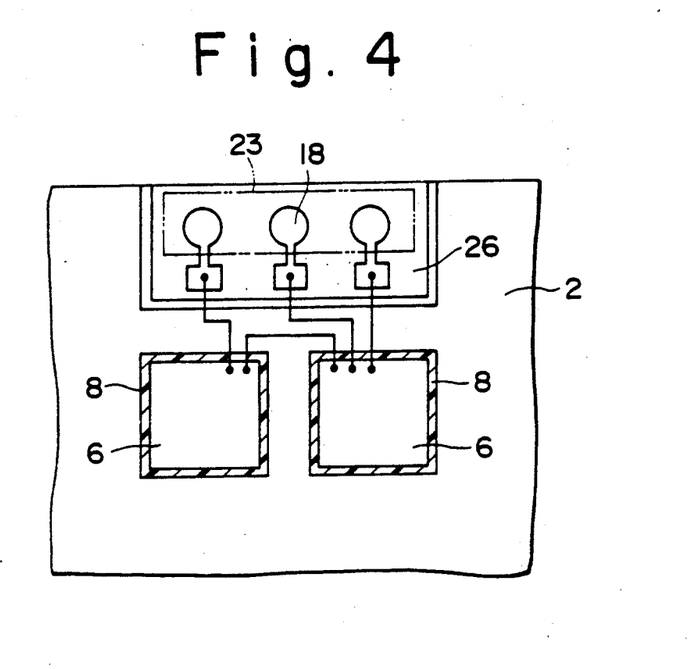
FIG. 4 is a plan view showing the arrangement of various parts in a main portion of an IC card manufactured according to the method including the steps shown in FIGS. 3a and 3b.

Thereafter, as shown in FIG. 3b, a polyimide layer 10 is formed on the entire surface of the structure, and, then, a contact hole is formed in the polyimide layer 10 in registry with the contact pad 9 provided on the main surface of the IC chip 6. Then, an aluminum layer 12 is formed on the polyimide layer 10 and then it is patterned to define an interconnection pattern. Thereafter, a passivation layer 16 is formed on the entire surface of the structure. FIG. 4 illustrates the arrangement of IC chips 6, printed circuit board 26 and interconnection pattern 12 formed on part of an IC card constructed in accordance with the method described with reference to FIGS. 3a and 3b.

Figure 5:
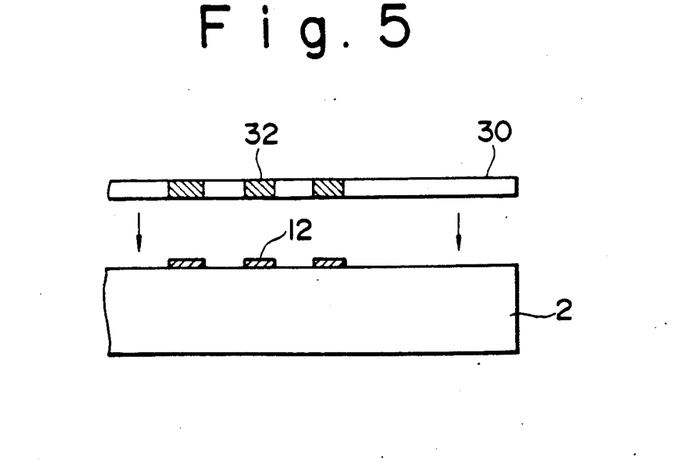
FIG. 5 is a schematic partly elevational and partly cross-sectional illustration showing a further IC mounting method in accordance with a further embodiment of the present invention.

FIG. 5 illustrates another method for forming an electrode. In accordance with this method, an interconnection pattern 12 is formed on the top surface of the substrate 2 by depositing an aluminum layer and patterning it. On the other hand, there is provided a cover sheet 30 having metal tablets 32 for electrodes. The cover sheet 30 is adhered to the top surface of the substrate 2 with the metal tablets 32 in registry with the interconnection pattern 12 in location.

As described above, in accordance with this aspect of the present invention, there is provided a method for manufacturing an IC mounted structure, such as an IC card, wherein use is made of a metal plate, such as a stainless steel plate, having an increased mechanical strength as compared with a plastic plate as a substrate. And, after embedding an IC chip in a hole or recess formed in the metal plate using a filler material, an interconnection pattern is formed, for example, by vapor deposition of an electrically conductive material and patterning of the thus deposited material. Thus, there is obtained an IC card having an increased resistance to bending and having no constraints in determining the location of an IC chip on the substrate.

Now, another aspect of the present invention will be described with reference to FIGS. 6 through 24. As described in the journal of "NIKKEI MICRODEVICE", April 1986, pp. 45-46, there is a known IC chip mounting method, according to which a hole is formed in a plastic substrate and an IC chip is fixedly provided in the hole by filling the gap between the hole and the IC chip with a filler resin material such that the surface of the IC chip is substantially flush with the surface of the substrate, followed by the step of providing an interconnection pattern on the IC chip and the substrate using a multi-layer interconnection technique.

Figure 23:
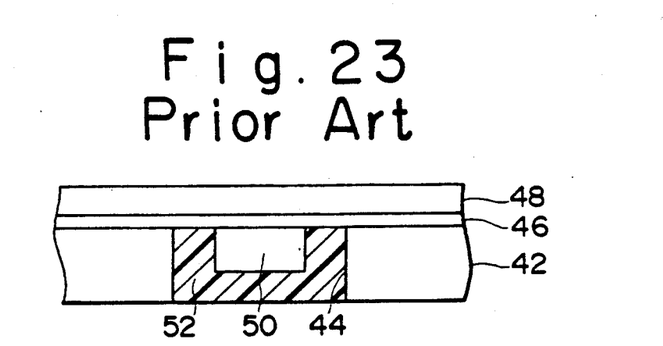
FIG. 23 illustrates a structure in which an IC chip has been mounted in a substrate in accordance with the prior art technique.

Such a prior art IC chip mounting method will be described more in detail with reference to FIGS. 23 and 24. In the first place, a hole 44 is formed in a plastic substrate 42 for locating therein an IC chip 50. A polyimide film 48 of approximately 12.5 microns thick is adhered to the surface of the substrate 42 with an FEP adhesive layer 46 of 2 to 2.5 microns thick sandwiched between the substrate 42 and the polyimide film 48. Use may, for example, be made of "Kapton" (trademark of du Pont Co.) as the polyimide film 48. Then, an IC chip 50 is located within the hole 44 of the substrate 42 such that the surface of the IC chip 50 is in contact with the FEP adhesive agent layer 46. Then, a filler material 52, e.g., epoxy resin material, is poured into the gap between the hole 44 and the IC chip 50 located within the hole 44 to fill the gap with the filler material 52.

Figure 24:
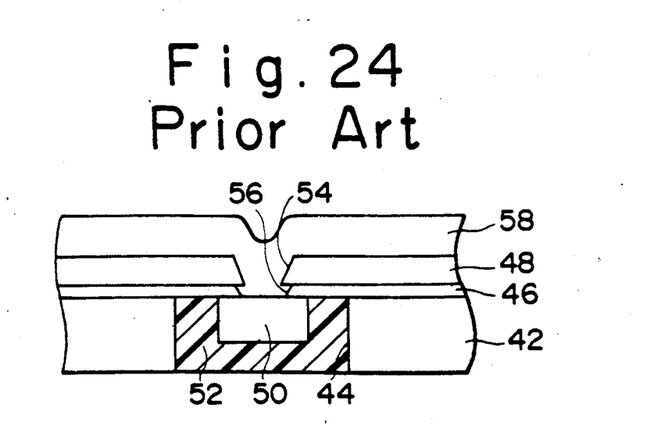
FIG. 24 illustrates the resulting structure when a contact hole is formed in the structure shown in FIG. 23.

Thereafter, as shown in FIG. 24, contact holes 54 and 56 are formed in the polyimide film 48 and FEP adhesive agent layer 46, respectively. In this case, in the first place, the polyimide film 48 is selectively etched by sodium hydroxide, and, thereafter, the FEP adhesive agent layer 46 is etched by an oxygen asher. The resulting contact hole typically has a step, as shown in FIG. 24. An electrically conductive layer 58 is formed in the contact holes 54 and 56 so as to establish an electrical connection between the contact pad of the IC chip 50 and an external circuit (not shown), and this electrically conductive layer 58 is typically formed by deposition of copper to a relatively large thickness of, for example, 5 microns because disconnection could occur at the step portion of the contact hole if this layer is not formed thick enough.

As described above, in accordance with the prior art method, since separate etching steps are applied to the adhesive agent layer 46 and the polyimide film 48 above the IC chip 50 to form a contact hole, a step portion is formed in the resulting contact hole which thus requires to form the electrically conductive layer 58 to a relatively large thickness. This aspect of the present invention is particularly directed to obviate this disadvantage. In accordance with this aspect of the present invention, there is provided an IC chip mounting method, according to which a contact hole is formed in an electrically insulating film above the IC chip by a single etching step without formation of a step portion, thereby permitting to prevent the occurrence of disconnection within the contact hole. That is, in accordance with this aspect of the present invention, a hole for placing therein an IC chip is formed in a substrate and a resin film is adhesively attached to the surface of the substrate using an adhesive agent. An IC chip is inserted into the hole of the substrate such that the surface of the IC chip comes into contact with the adhesive agent, and, then, a filler material is filled in the gap between the hole and the IC chip inserted into the hole. In this case, the resin film adhesively attached to the surface of the substrate and the adhesive agent are both selected to be of the polyimide family. With this structure, when a contact hole is formed extending through the resin film and the underlying adhesive agent layer, use may be made of the same etchant to etch the resin film and the adhesive agent layer, thereby permitting to form a contact hole without a stepped portion above the IC chip.

On the other hand, in accordance with this aspect of the present invention, after having inserted an IC chip into the corresponding hole in the substrate, the resin film on the substrate and the adhesive agent layer are removed, and, then, a polyimide film is again formed on the surface of the substrate by deposition. Then, a contact hole is formed in this newly formed polyimide film. In this case, in order to remove the resin film and the adhesive agent layer on the substrate, use may be made of an etching technique or a peel off technique.

Figure 6:
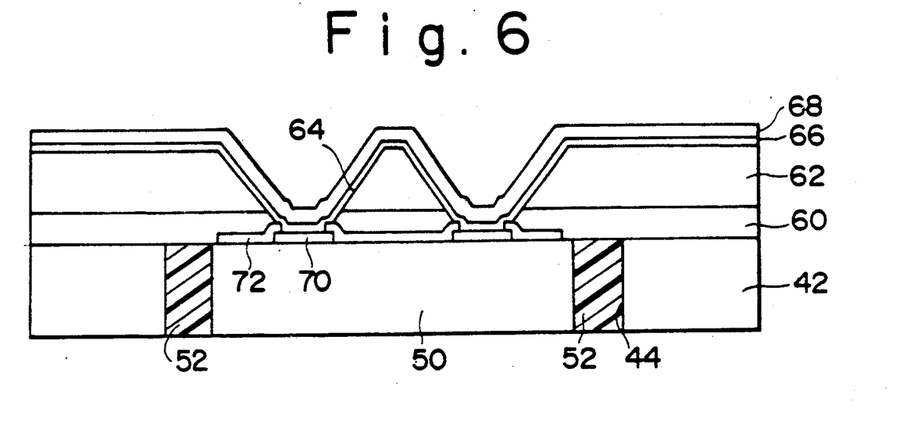
FIG. 6 is a partly elevational and partly cross-sectional view showing a structure in which an IC chip has been mounted by a still further IC mounting method of the present invention.

This aspect of the present invention will be described more in detail with reference to FIGS. 6 through 22. FIG. 6 illustrates an IC chip mounted structure which may be manufactured according to one embodiment of this aspect of the present invention. As shown in FIG. 6, an IC chip 50 is located within a hole 44 of a substrate 42 as fixed in position by a filler material 52 filling the gap between the hole 44 and the IC chip 50. Use may, for example, be made of stainless steel for the substrate 42, and this is advantageous because the substrate 42 possesses an increased mechanical strength as compared with a prior art plastic substrate. When mounted as shown in FIG. 6, the main surface of the IC chip 50, on which at least one contact pad is provided, is substantially flush with the main surface of the substrate 42. Using a polyimide family adhesive agent 60, a polyimide film 62 is adhesively attached to the main surface of the substrate 42 and also to the main surface of the IC chip 50. Use may be preferably made of "Kapton" as the polyimide film 62. A contact hole 64 is formed extending through the polyimide film 62 and the underlying polyimide adhesive agent layer 60. And, an electrically conductive layer including a chrome sub-layer 66 and a copper sub-layer 68 is formed to establish an electrical connection between a contact pad 70 on the main surface of the IC chip 50 and an external circuit (not shown) through the contact hole 64. Also shown in FIG. 6 is a PSG layer 72 formed on the main surface of the IC chip 50. The contact pad 70 of the IC chip 50 is preferably comprised of aluminum.

Now, an IC mounting method for manufacturing the structure shown in FIG. 6 will be described with particular reference to FIGS. 7 through 18.

Figure 7:
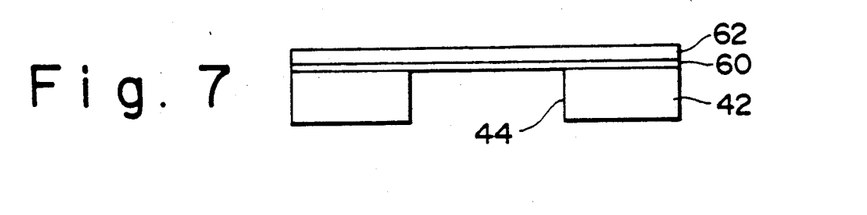
FIGS. 7 through 18 illustrate various steps of the IC mounting method for manufacturing the structure shown in FIG. 6.

(1) Prepare a stainless steel substrate 42 of approximately 500 microns thick and a hole 44 for locating therein an IC chip 50 is formed in the substrate 42.

(2) A polyimide film 62 of approximately 7.5 microns thick is adhesively attached to the surface of the substrate 42 by means of a polyimide family adhesive agent layer 60 of approximately 2 microns thick.

Figure 8:
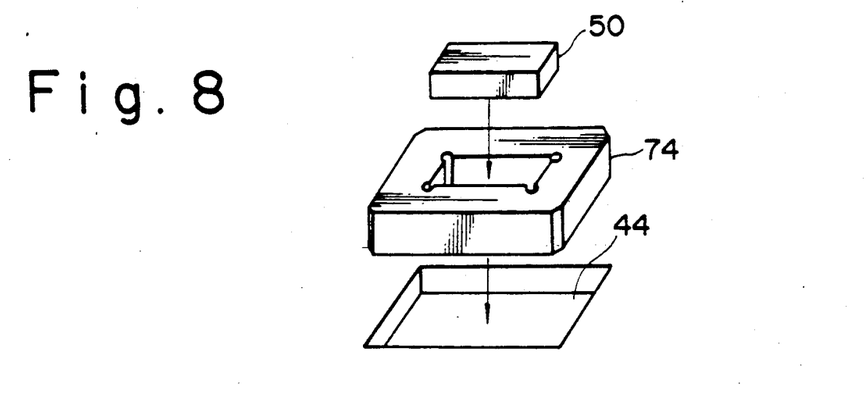
Figure 9:
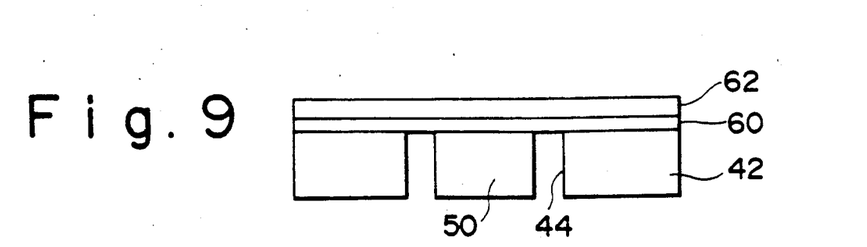

(3) An IC chip 50 is inserted into the hole 44 of the substrate 42 to be adhesively adhered to the polyimide family adhesive agent layer 60. For adhesively attaching the IC chip 50, the substrate 42 is placed on a hot plate with the polyimide film 62 located at the bottom. Then, as shown in FIG. 8, a positioning unit 74 having a positioning hole commensurate in shape with the outer peripheral shape of the IC chip 50 is fitted into the hole 44, and, then, the IC chip 50 is fitted into the positioning hole of the positioning unit 74 with its main surface facing downward, so that the main surface of the IC chip 50 comes into contact with the adhesive agent layer 60. In this case, the hot plate is heated to the temperature of approximately 150° C. FIG. 9 shows the condition in which the IC chip 50 has been adhesively attached as described above.

Figure 10:
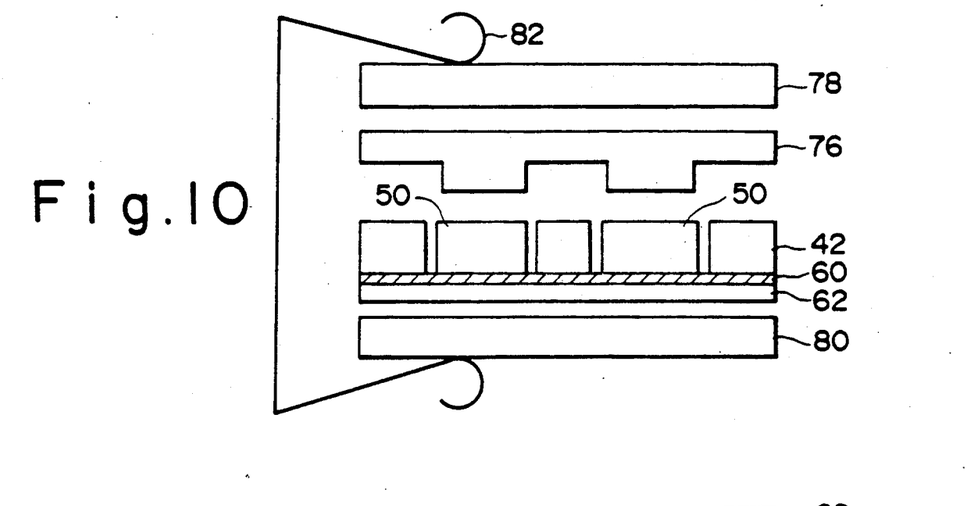

(4) As shown in FIG. 10, in order to harden the adhesive agent 60, the IC chips 50 are held in position by a holding unit 76 and a pair of top and bottom glass plates 78 and 80 is provided to sandwich the entire structure. And, a clip 82 is fitted to apply a pressing force between the top and bottom glass plates 78 and 80. Then, the entire structure is placed in a furnace for 1.5 hours at 150° C. and then for 30 minutes at 20° C.

Figure 11:
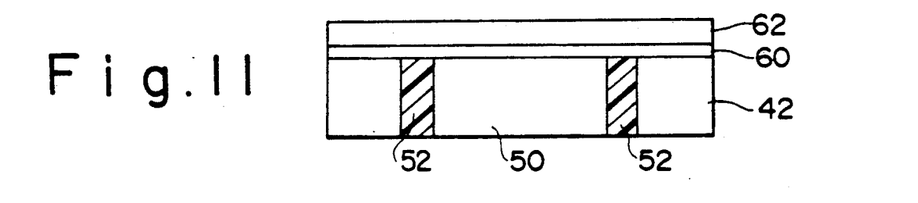

(5) Then, a resin material 52 is poured into the gap between the hole 44 of the substrate 42 and the IC chip 50 to fill the gap. Use is preferably made of an epoxy resin material as the resin material 52. Then, the entire structure is placed in a vacuum debubbler to have the bubbles present in the resin 52 removed. Thereafter, in order to harden the resin 52, the entire structure is placed in a dryer furnace for 1 hour at 100° C. and then for 4 hours at 160° C. FIG. 11 shows the condition in which the resin 52 fills the gap between the hole 44 of the substrate 42 and the IC chip 50 to securely hold the IC chip 50 in position.

Figure 12:
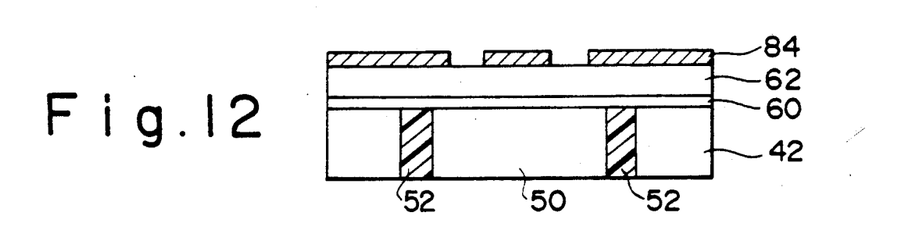

(6) Then, after washing the substrate 42 embedded with the IC chip 50, a photoresist layer 84 is formed on the surface of the polyimide film 62, as shown in FIG. 12. After prebake, the photoresist layer 84 is exposed to a light pattern. Then, the photoresist layer 84 is developed, rinsed, and subjected to postbaking to form a photoresist pattern.

Figure 13:
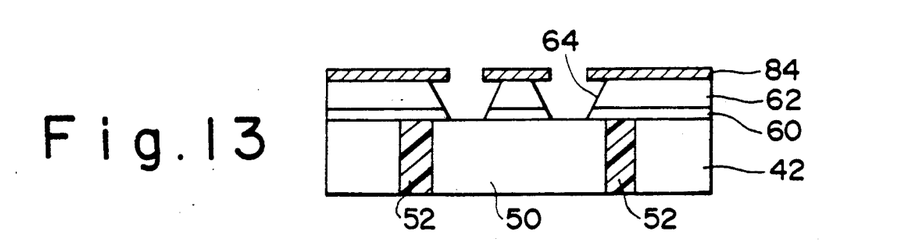

(7) Using the photoresist pattern 84 as a mask, the polyimide film 62 and the polyimide family adhesive agent 60 are etched to define a contact hole 64. In this case, a mixture solution of hydrazine and ethylenediamine is used as an etching solution. Since both of the polyimide film 62 and the polyimide family adhesive agent 60 are etched by this etching solution, the contact hole 64 can be formed simply by a single etching step.

Figure 14:
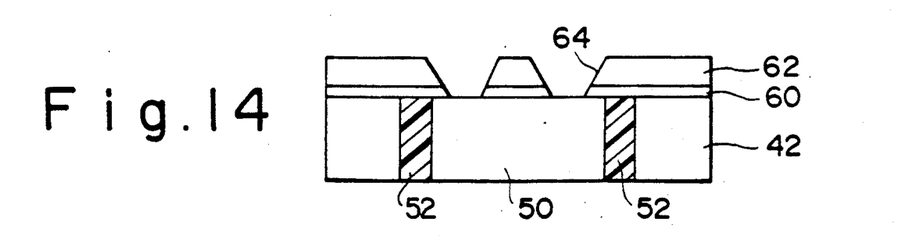

(8) After peeling off the photoresist layer 84 by an asher, a cover layer of aluminum oxide covering the contact pad of the IC chip 50 is removed. FIG. 14 shows the resulting structure.

Figure 15:
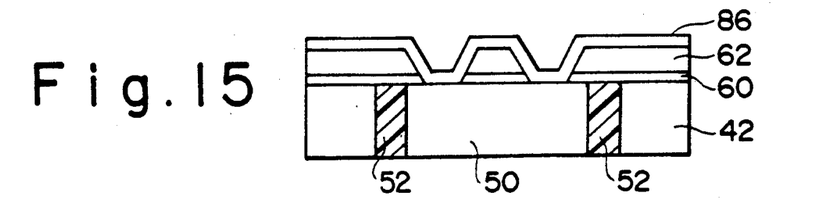

(9) Then, as shown in FIG. 15, an electrode layer 86 is formed on the surface of the structure. The electrode layer 86 includes an underlying chrome sub-layer of approximately 1,000 angstroms thick and an overlying copper sub-layer of approximately 8,800 angstroms thick.

Figure 16:
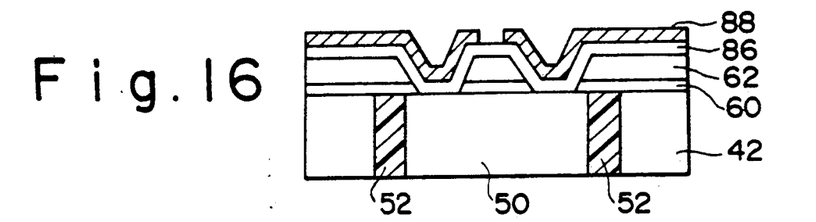

(10) A photoresist layer 88 is formed on the electrode layer 86, and the photoresist layer 88 is exposed to a light pattern and developed to define a resist pattern. FIG. 16 illustrates the resulting structure.

Figure 17:
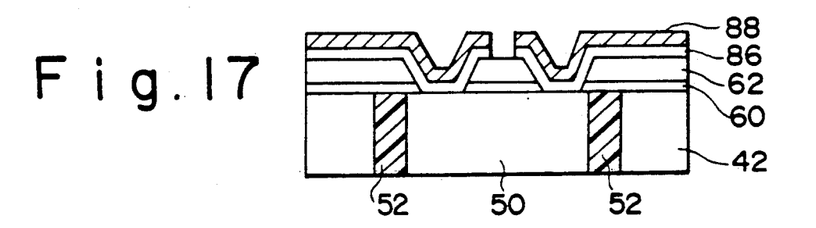

(11) Then, using the photoresist pattern 88 as a mask, the electrode layer 86 is etched to define a etching pattern. Use is made of a solution of ferric chloride for etching the copper sub-layer of the electrode layer 86 and use is made of a mixture solution of potassium ferricyanide and potassium hydroxide for etching the chrome sub-layer. FIG. 17 illustrates the resulting structure of the electrode layer 86 after such etching step.

Figure 18:
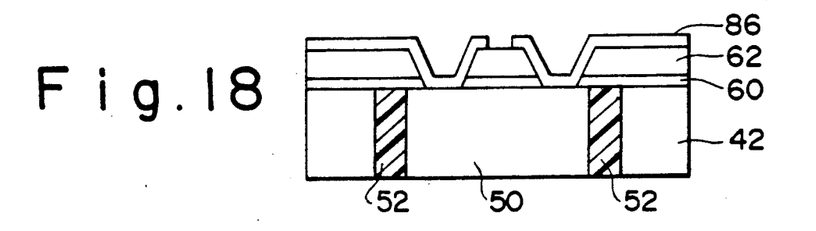

(12) Then, the photoresist pattern 88 is removed. FIG. 18 illustrates the structure in which the electrode layer 86 of a desired pattern to establish an electrical connection between the contact pad of the IC chip 50 and an external circuit (not shown) through the contact hole 64 is formed. FIG. 6 shows more specific details of the structure shown in FIG. 18.

In the above-described embodiment, the polyimide film 62 adhesively attached to the surface of the substrate 42 is used as an electrically insulating layer and the contact hole is formed in this polyimide film 62. However, after removing both of the polyimide film 62 and the polyimide family adhesive agent layer 60 by blanket etching using an etching solution which is a mixture solution of hydrazine and ethylenediamine, a new polyimide film can be formed on the surface of the substrate 42 by spinning to the thickness of 1–3 microns. And, a contact hole is formed in the newly formed polyimide film in a manner similar to that described in the above embodiment, and, then, an electrode layer is formed.

Figure 19:
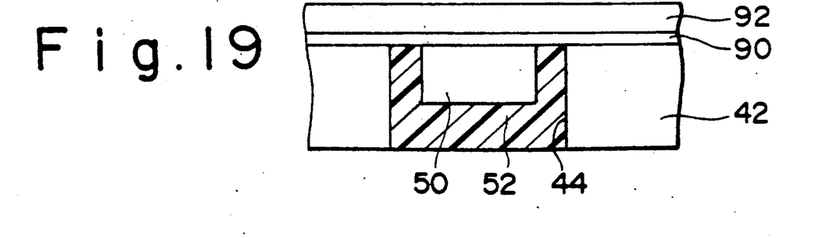
FIG. 19 illustrates a structure in which an IC chip has been mounted by a still further embodiment of the present invention.

FIG. 19 shows another embodiment of this aspect of the present invention. In this case, a PET acrylic family resin film 92 is adhesively attached to the surface of the substrate 42 by an acrylic family adhesive agent 90. And, in a manner similar to that described in the above embodiment, an IC chip 50 is inserted into the hole 44 of the substrate 42 and a filler material 52 is provided to have the IC chip 50 fixed in position, and, then, the acrylic family resin film 92 and the acrylic family adhesive agent 90 are removed. After removal, if any of the adhesive agent 90 remains on the surface of the substrate 42, the remaining adhesive agent is removed by oxygen ashing. Thereafter, another polyimide film is formed on the surface of the substrate 42 by spinning to the thickness of 1–3 microns, and, then, a contact hole is formed in the newly formed polyimide film, followed by the step of formation of an electrode film.

As described above, in accordance with this aspect of the present invention, since the insulating layer formed on the surface of the IC chip 50 includes only a polyimide film and a polyimide family adhesive agent or a polyimide film alone, it is required to etch the insulating layer only once to form a contact hole in the insulating layer, so that there is no chance of forming a stepped portion in the resulting contact hole as in the case of the prior art technology, which requires two steps of etching in forming a contact hole. Accordingly, even if the electrode layer 86 is formed to be relatively thin, there is no problem of creating disconnection.

Figure 20:
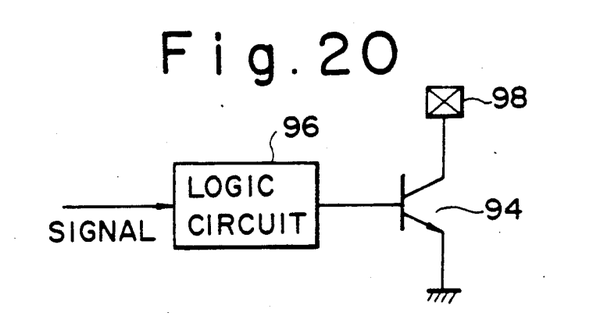
FIG. 20 illustrates a driver circuit of a thermal print head in operative association with a single heat-producing element.

Now, a description will be had with respect to the case in which the present IC mounting method is applied to the case in which an IC chip is mounted on a thermal print head. In FIG. 20, there is provided a driver transistor 94 whose operation is controlled by a logic circuit 96. Print data is supplied to the logic circuit 96 as an input signal. Also shown in FIG. 20 is a pad 98 which is electrically connected to a selection electrode of a heat-producing element of a thermal print head. In the case of a thermal print head, current in the order of 20–80 mA flows for a single heat-producing element. And, a plurality of heat-producing elements are provided as arranged in the form of a single array at a predetermined pitch. Such a plurality of heat-producing elements are typically divided into a plurality of blocks each of which includes a predetermined number of heat-producing elements. For example, each block has 32 or 64 heat-producing elements which are controlled by a single IC chip simultaneously. In this case, the current flowing through the IC chip can become relatively large.

Figure 21:
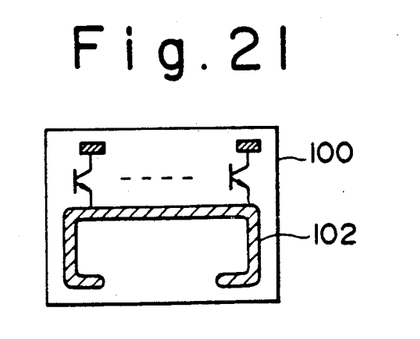
FIG. 21 illustrates the structure of a ground line commonly provided in an IC chip for use in a thermal print head.
Figure 22:
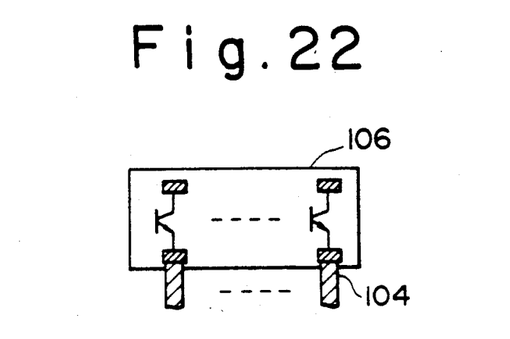
FIG. 22 illustrates the arrangement of ground lines on an IC chip for use in a thermal print head in accordance with a still further embodiment of the present invention.

As shown in FIG. 21, in the typical prior art driver IC chip, a ground line 102 having a large line width is formed as a gold bump on the surface of the IC chip 100. This ground line 102 is required to have a broad region to reduce its resistance because current of a relatively large amount flows therethrough. And, moreover, since the IC chip 100 is bonded to a tape carrier by the TAB method, a pressing force is applied to this ground line 102, so that the ground line 102 can be formed only in a non-active region on the surface of the IC chip 100. Accordingly, because of the necessity to form this ground line 102, there is present a problem of the IC chip 100 tending to be bulky. On the other hand, FIG. 22 illustrates the case when a ground line 104 is formed in accordance with one embodiment of the present invention. In the present case, an IC chip 106 as a driver of a thermal print head is embedded in a substrate, and an interconnection between the IC chip 106 and an external circuit is formed by photolithography, so that the ground line 104 may be formed from an electrically conductive material on an inter-layer insulating film. For this reason, it is not necessary to form a broad region of an electrically conductive material on the surface of the IC chip 106 so as to obtain a reduced electrical resistance. In this manner, when the present invention is applied to the case of mounting an IC chip in a thermal print head assembly, there is attained an advantage of capability to make the IC chip 106 smaller in size.

As described above, in accordance with this aspect of the present invention, when an IC chip is mounted as embedded in a hole of a substrate, since the inter-layer insulating film above the IC chip includes a polyimide film and a polyimide family adhesive agent or a polyimide film alone, only a single etching step is required to form a contact hole in the inter-layer insulating film at a location above the IC chip and no stepped portion is formed in the resulting contact hole, which contributes to prevent the occurrence of disconnection in an electrode film formed in the contact hole.

Now, a further aspect of the present invention will be described with reference to FIGS. 26a and 25b through 28. In mounting an IC chip in the prior art method for manufacturing a wafer scale IC, a recess is formed in a wafer and an IC chip is inserted into the recess and fixed in position, or an IC chip is fixedly attached to a support plate of aluminum or stainless steel. However, in such a method, since the bottom surface of the IC chip is fixedly attached to the bottom of the recess formed in a wafer or on the surface of the support plate, it is relatively difficult to control the arrangement of a plurality of IC chips while keeping their main surfaces coplanar. In addition, when use is made of an electrically conductive material for the support plate, an IC chip using an N type substrate cannot be mixed with an IC chip using a P type substrate.

This aspect of the present invention is directed to obviate such a problem and to provide an IC mounting method which permits to arrange a plurality of IC chips different in characteristic on the same support plate and also to establish an interconnection between the IC chips by a metal interconnection defined by lithography.

Figure 25A:
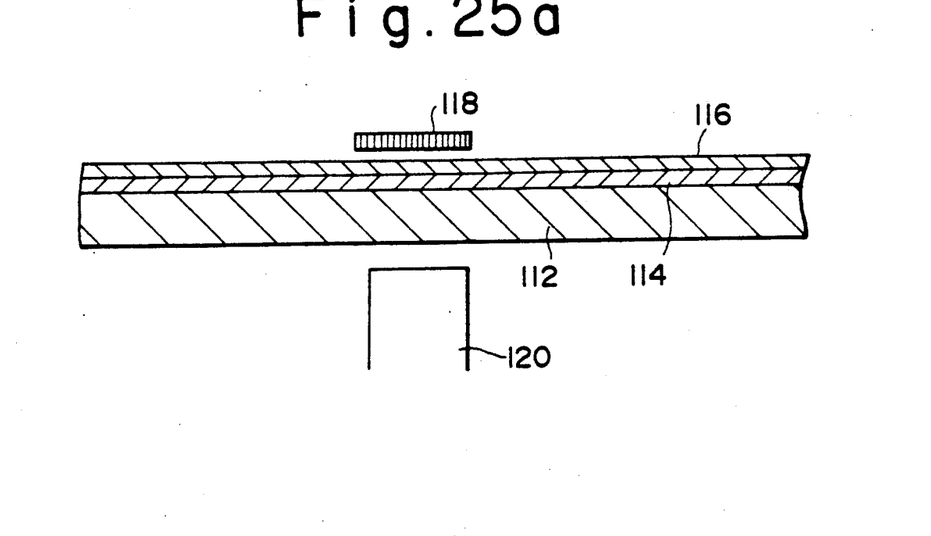
FIGS. 25a, 25b, 26, 27 and 28 illustrate an IC chip mounting method and its resulting structure in accordance with a still further embodiment of the present invention.

As shown in FIG. 25a, use is made of a glass plate 112 as a substrate having a flat surface, and a separating thin film 114 is formed on the surface of the glass plate 112 and a protection thin film 116 is formed on the separating thin film 114. The separating thin film 114 is provided to aid in separating an IC chip or the like from the glass plate 112 upon completion of processing the bottom surface of the IC chip or the like. As the separating thin film 114, use may be made, for example, of a positive resist material. That is, the positive resist becomes hardened by irradiation of light, thereby losing its adhesiveness to the glass plate 112, so that the IC chip or the like may be easily removed from the glass plate 112. As the separating thin film 114, use may also be made of a material which becomes hardened due to application of heat. In addition, use may also be made of a material which generates gas due to application of light or heat and such gas causes the IC chip or the like to be separated from the glass plate 112 with ease.

Figure 25B:
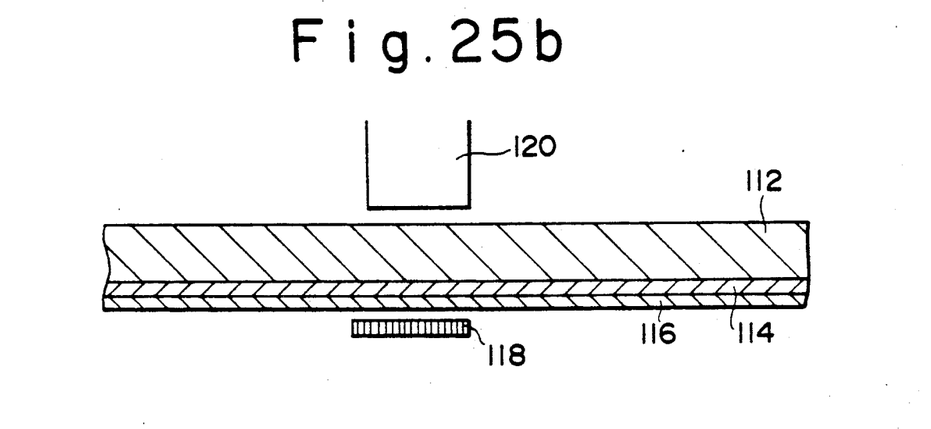

The protecting thin film 116 is to protect the surface of an IC chip or the like which is brought into close contact therewith and to prevent the IC chip or the like from shifting its position after having been fixed in position on the glass plate 112. An IC chip 118 is brought into contact with the protecting thin film 116 from above with its surface facing the protecting thin film 116, whereby an optical sensor 120 is used to carry out position matching during the process of bringing the IC chip 118 into close contact with the protecting thin film 116. In the case of FIG. 25a, the IC chip 118 is brought into contact with the protecting thin film 116 from above; whereas, as shown in FIG. 25b, the glass plate 112 having thereon the separating thin film 114 and the protecting thin film 116 may be turned upside down and the IC chip 118 may be brought into close contact with and fixed to the protecting thin film 116 from bottom using an optical sensor for position matching. In the latter case, the IC chip 118 is so oriented with its surface facing the protecting thin film 116 of the glass plate 112.

Figure 26:
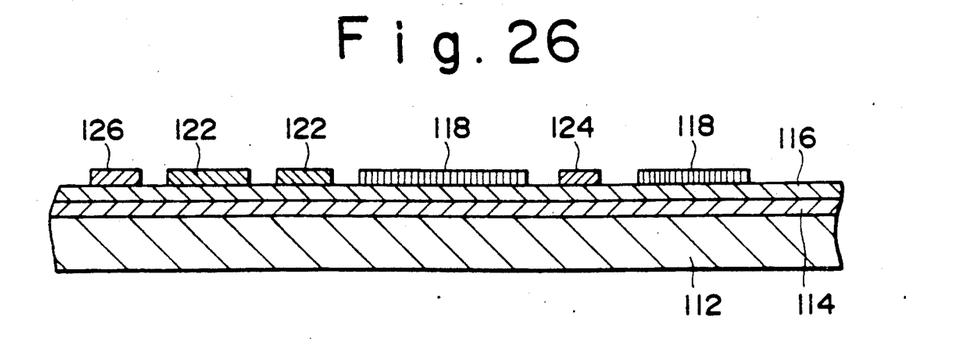

FIG. 26 illustrates the condition when IC chips 118 or the like have already been arranged on the protecting thin film 116. Anything other than IC chips 118 may be arranged on the glass plate 112. For example, in FIG. 26, it is assumed that numeral 118 denotes an IC chip using a P type substrate; 122 denotes an IC chip using an N type substrate; 124 denotes a metal plate; and 126 denotes an IC chip for a resistor, capacitor or a coil. The metal plate 124 is provided as a rear side interconnection for the IC chips 118 and 122. In addition to the IC chips 118 and 122, an IC chip 126 for a resistor or the like are all arranged with their surfaces in contact with the protecting thin film 116 and fixed thereto.

Figure 27:
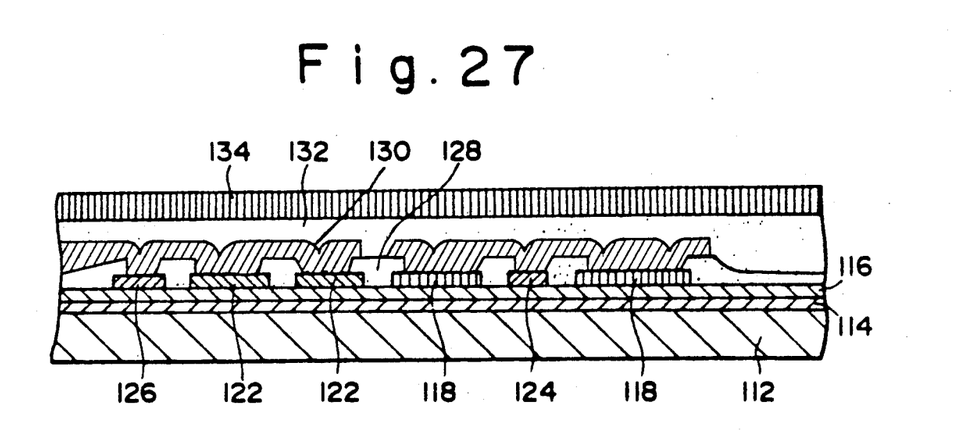

As shown in FIG. 27, a first electrically insulating layer 128 is formed on the surface of the structure to present a flat surface. The insulating layer 128 may be formed by a polyimide resin material or an epoxy family resin material. Using photolithography, a contact hole is formed in this insulating layer 128, and then a first metal interconnection layer 130 is formed thereon. With the formation of this metal interconnection layer 130, it is now made possible to mix an IC chip 118 using a P type substrate with an IC chip 122 using an N type substrate, or a mixture of an analog IC with a power IC. Moreover, in addition to IC chips 118, 122 and 126, the provision of the metal plate 124 allows the interconnection among the rear surfaces of the IC chips 118, 122 and 126 to be extended to the front surface.

After formation of the metal interconnection 130, a second electrically insulating layer 132 is formed on the entire surface of the structure. As this second insulating layer 132, use may be made of a polyimide resin material or an epoxy family resin material. Using an adhesive agent, the second insulating layer 132 is adhesively attached to a support plate 134, thereby having the IC chips 118, 122 and 126 and the metal plate 124 fixed in position. The support plate 134 may be formed from a metal plate of aluminum or stainless steel or from a ceramic plate, and it is preferable that the support plate 134 has an excellent thermal conductivity. On the other hand, the support plate 134 may be formed from a flexible resin film.

Figure 28:
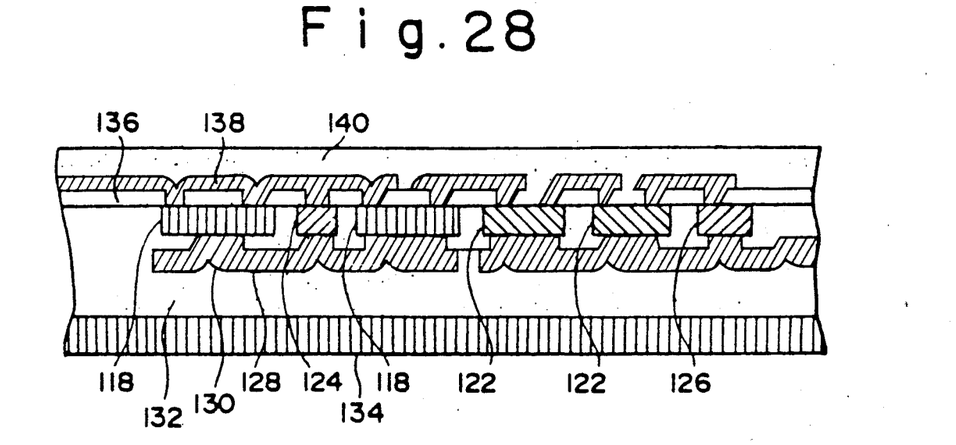

Then, a processing, such as exposure to light, is applied to the separating thin film 114 so as to have the glass plate 112 removed. And, then, the separating than film 114 and the protecting thin film 116 are removed by etching. Under this condition, the IC chips 118, 122 and 126 and the metal plate 224 have a coplanar surface. As shown in FIG. 28, a third electrically insulating film 136, such as a polyimide film, is formed on the surface which includes the surfaces of the IC chips 118 or the like, and, then, a contact hole is formed in this third insulating film 136, for example, by lithography. Then, a metal layer is formed and the metal layer is patterned by photolithography to define a second metal interconnect 138. The IC chips 118 are fixed in position as being aligned in position and their surfaces are substantially coplanar, so that the metal interconnect 138 may be defined using a reticle. After formation of the metal interconnect 138, a passivation layer 140 is formed thereon as a protecting layer, thereby completing the mounting of IC chips 118 or the like.

In accordance with this aspect of the present invention, IC chips or the like are arranged on a substrate as being aligned in position with their surfaces facing a flat surface of the substrate, so that when the substrate is removed, the surfaces of the IC chips thus arranged are coplanar, thereby permitting to define a metal interconnect by a lithographic process using a mask. In addition, by providing a metal interconnect also on the bottom surface of an IC chip, IC chips having substrates of different characteristics, such as an IC chip having a P type substrate and an IC chip having an N type substrate, IC chips having different reference voltages, a mixture of MOS and bipolar transistors, and a mixture of a coil and a capacitor may be mounted on the same support plate.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A method for manufacturing an IC card, comprising the steps of:
   providing a metal plate of a desired shape, said metal plate having a first surface;
   forming at least one hole through said plate;
   locating an IC chip inside of said hole and filling a gap between said hole and said IC chip to fix said IC chip in location, said IC chip having a second surface on which at least one contact pad is formed;
   forming an electrically insulating layer covering said first and second surfaces;
   forming a hole in said insulating layer at desired location thereof and extending therethrough;
   forming a metal layer on said insulating layer at least at a location above said IC chip; and patterning said metal layer to define an interconnection pattern which is in electrical connection to said contact pad of said IC chip.

2. The method of claim 1, wherein, at said step of locating, said second surface of said IC chip is set substantially flush with said first surface of said metal plate.

3. A method for mounting an IC chip, comprising the steps of:
 (a) adhesively attaching a polyimide film to a substrate formed with at least one hole using a polyimide family adhesive agent, said substrate having a first surface;
 (b) inserting an IC chip, which has at least one contact pad at a second surface thereof, into said hole such that said second surface of said IC chip is brought into adhesive contact with said polyimide family adhesive agent;
 (c) filling a gap between said hole and said IC chip with a filler material;
 (d) forming a contact hole extending through said polyimide film and said polyimide family adhesive agent; and
 (e) forming an interconnect which extends through said contact hole to be in electrical connection with said contact pad of said IC chip.

4. The method of claim 3, wherein said second surface of said IC chip is substantially flush with said first surface of said substrate when said IC chip is inserted at said step (b).

5. An IC chip mounting method, comprising the steps of:
 (a) adhesively attaching a resin film to a substrate formed with at least one hole using an adhesive agent, said substrate having a first surface;
 (b) inserting an IC chip, which has at least one contact pad on its second surface, into said hole such that said second surface of said IC chip is brought into adhesive contact with said adhesive agent;
 (c) filling a gap between said hole and said IC chip with a filler material;
 (d) removing said resin film and said adhesive agent from said substrate;
 (e) forming a polyimide film covering said first and second surfaces;
 (f) forming at least one contact hole through said polyimide film in registry in position with said contact pad of said IC chip; and
 (g) forming an interconnect extending through said contact hole to be in electrical contact with said contact pad of said IC chip.

6. The method of claim 5, wherein said first surface is substantially flush with said second surface when said IC chip is set in position at said step (b).

7. The method of claim 5, wherein said polyimide film formed at said step (e) has a thickness ranging between 1 and 3 microns.

8. The method of claim 5, wherein said resin film is a polyimide film and said adhesive agent is a polyimide family adhesive agent, whereby these polyimide film and said polyimide family adhesive agent are removed by blanket etching using a common etchant.

9. The method of claim 5, wherein said resin film and said adhesive agent are removed by peeling.

10. An IC chip mounting method, comprising the steps of:
 (a) forming at least one first film on a first flat surface of a substrate;
 (b) providing at least one IC chip on said first film as being aligned in position with a first surface, on which at least one contact pad is provided, of said IC chip facing said first film;
 (c) forming a first electrically insulating film on said first film covering a second surface of said IC chip provided on said first film;
 (d) forming at least one contact hole in said first insulating film;
 (e) forming a first metal interconnect on said first insulating film;
 (f) forming a second electrically insulating film on said first metal interconnect;
 (g) adhesively attaching a support plate to said second insulating film;
 (h) applying a predetermined processing to said first film to have said first film separated away from said substrate;
 (i) removing said first film from said IC chip;
 (j) forming a third electrically insulating film on said IC chip;
 (k) forming at least one contact hole in said third insulting film; and
 (l) forming a second metal interconnect on said third insulating film.

11. The method of claim 10, further comprising the step of (m) forming a protecting film covering said second metal interconnect after said step (1).

12. The method of claim 10, wherein said predetermined processing at said step (h) is to apply light to said first film, whereby said first film becomes hardened by application of light, thereby losing adhesive contact with said substrate.

13. The method of claim 10, wherein said predetermined processing at said step (h) is to apply heat to said first film, whereby said first film becomes hardened by application of heat, thereby losing adhesive contact with said substrate.

14. The method of claim 10, wherein said first film includes a first sub-film formed on said substrate and a second sub-film formed on said first sub-film.

15. The method of claim 14, wherein said first sub-film is a separating sub-film and said second sub-film is a protecting sub-film.

16. The method of claim 15, wherein said first sub-film includes a photoresist.

17. The method of claim 10, wherein other elements than said IC chip are also provided on said first film at said step (b).

* * * * *